(12) United States Patent
Bradley et al.

(10) Patent No.: US 6,804,501 B1
(45) Date of Patent: Oct. 12, 2004

(54) RECEIVER HAVING GAIN CONTROL AND NARROWBAND INTERFERENCE DETECTION

(75) Inventors: Wayne H. Bradley, West Chicago, IL (US); John W. Diehl, Elmhurst, IL (US)

(73) Assignee: PrairieComm, Inc., Rolling Meadows, IL (US)

( * ) Notice: Subject to any disclaimer, the term of this patent is extended or adjusted under 35 U.S.C. 154(b) by 771 days.

(21) Appl. No.: 09/669,015

(22) Filed: Sep. 25, 2000

(51) Int. Cl.[7] .............................................. H04B 17/02
(52) U.S. Cl. ................. 455/138; 455/241.1; 455/245.2; 455/251.1
(58) Field of Search .......................... 455/226.1–226.3, 455/232.1, 234.1, 234.2, 240.1, 241.2, 245.1, 253.2, 67.11, 63.1, 251.1, 241.1, 138, 139

(56) References Cited

U.S. PATENT DOCUMENTS

| | | | | |
|---|---|---|---|---|
| 5,093,923 A | * | 3/1992 | Leslie | 455/67.11 |
| 5,446,756 A | * | 8/1995 | Mallinckrodt | 375/130 |
| 6,272,325 B1 | * | 8/2001 | Wiedeman et al. | 455/117 |
| 6,459,889 B1 | * | 10/2002 | Ruelke | 455/296 |

* cited by examiner

Primary Examiner—Charles Craver
(74) Attorney, Agent, or Firm—Grossman & Flight, LLC

(57) ABSTRACT

A receiver generates two metrics, one that is used to control the gain of an amplifier and the other that is used to determine the presence of narrowband interference, such as IMD. The two metrics may represent analog-to-digital converter (A/D) saturation and average signal strength, either of which may be used to control gain or to detect the presence of narrowband interference.

22 Claims, 8 Drawing Sheets

RECEIVER HAVING GAIN CONTROL AND NARROWBAND INTERFERENCE DETECTION

TECHNICAL FIELD

The present invention is directed to communication receivers and, more particularly, to communication receivers having gain control and narrowband interference detection.

BACKGROUND ART

The elimination or minimization of narrowband interference such as intermodulation distortion (IMD), is important to the operation of any code-division multiple-access (CDMA) communication system. Narrowband interference reduces the quality of the signals processed by CDMA receivers by, for example, saturating analog-to-digital (A/D) converters used by CDMA receivers.

One source of narrowband interference may be an amplifier stage of a CDMA receiver. Most commonly, IMD is created in a low power, low noise amplifier (LNA) having a non-linear output characteristic at high input levels. The non-linear characteristic of LNAs is conducive to producing IMD when an undesired signal (e.g., a signal that the receiver is not to receive) is present with the desired signal (e.g., a signal that the receiver is to receive). When a desired signal is amplified by the LNA in the presence of an undesired signal, harmonics of the desired and undesired signals interact to create a third, or higher, order IMD products that fall within the frequency band of the receiver.

Generally, one known technique of combating narrowband interference in a CDMA receiver is to attenuate a received signal before the received signal is amplified by the LNA of the CDMA receiver. In particular, an attenuator in the CDMA receiver decreases the energy level of the received disposed signal to a point at which the received signal-to-noise ratio (SNR) is a minimum acceptable level. This attenuation technique is effective because the amplitude of narrowband interference, such as IMD, reduces exponentially with the attenuation of the amplitude of the received signal. Thus, by attenuating the received signal as much as possible (e.g., to a minimum acceptable SNR level) narrowband interference is reduced as much as possible.

While the attenuation technique is effective in reducing narrowband interference, such a technique has the undesirable effect of reducing SNR to a minimum level, regardless of whether narrowband interference is actually present. Accordingly, SNR is always sacrificed, regardless of whether narrowband interference is present. The needless sacrifice of SNR when narrowband interference is not even present is undesirable in communication systems, such as voice, data or other systems that seek to provide maximal clarity and understandability of communication.

Another technique for eliminating narrowband interference includes eliminating the low power LNA of the receiver in favor of a higher powered amplifier having linear characteristics in the presence of large amplitude input signals. While the linearity of a high power amplifier reduces the probability of generating narrowband interference, high power amplifiers also increase current consumption of the devices in which they are used. In the portable communications market, having numerous portable devices powered by batteries, an increase in amplifier power consumption leads to reduced battery life, which is of great concern to many consumers who desire not to be tethered by power cords. Accordingly, in an effort to eliminate narrowband interference, which may only be periodically present, battery life would always be sacrificed through the elimination of a low power LNA in favor of a high power amplifier having linear characteristics.

The two approaches for eliminating or reducing narrowband interference that are discussed above sometimes needlessly sacrifice signal-to-noise ratio or battery life when narrowband interference is not even present. Such tradeoffs are significant and would ideally be avoided altogether when attempting to eliminate or reduce narrowband interference in a communication receiver.

SUMMARY OF THE PREFERRED EMBODIMENTS

A receiver generates two metrics, one that is used to control the gain of an amplifier and the other that is used to determine the presence of narrowband interference, such as IMD. The two metrics may represent analog-to-digital converter (A/D) saturation and average signal strength, either of which may be used to control gain or to detect the presence of narrowband interference.

According to a first aspect, the present invention may be embodied in an automatic gain controller for use with a receiver adapted to receive a broadcast signal having digital information encoded therein. The receiver may include a first amplifier having a fixed gain setting and a unity gain setting, a second amplifier cascaded with the first amplifier, wherein the second amplifier has a variable gain, and an automatic gain controller. In such an arrangement, the automatic gain controller may include a signal strength determiner adapted to process the digital information to produce a signal strength metric representative of an average signal strength of the broadcast signal and a threshold comparator adapted to process the digital information to produce a threshold satisfaction indication representative of a magnitude of the digital information in comparison to a threshold. The automatic gain controller may also include an accumulator communicatively coupled to the threshold comparator and adapted to process the threshold satisfaction indication to determine a historical probability that the digital information exceeds the threshold to produce a threshold satisfaction metric and a gain adjuster that may be communicatively coupled to the signal strength determiner, the accumulator, the first amplifier and the second amplifier. The gain adjuster may be adapted to selectively switch the first amplifier between the fixed gain setting and the unity gain setting and to vary the gain of the second amplifier based on the signal strength metric and the threshold satisfaction metric.

The signal strength determiner may processes the digital information by summing a number of absolute values of analog signal levels represented by the digital information and dividing the sum by the number of absolute values over which the sum was taken or by summing a number of squared values of analog signal levels represented by the digital information and dividing the sum by the number of squared values over which the sum was taken to produce the signal strength metric. Alternatively, the digital information may be processed by summing a number of squared absolute values of analog signal levels represented by the digital information and dividing the sum by the number of squared absolute values over which the sum was taken to produce the signal strength metric.

The gain adjusted may be adapted to compare a current value of the signal strength metric with a prior value of the signal strength metric to determine whether the second amplifier should be set to the fixed gain setting. Further, the gain adjuster may be adapted to set the second amplifier to the fixed gain setting when the current value of the signal strength metric is substantially equal to the prior value of the signal strength metric. Alternatively, the gain adjuster may be adapted to set the first amplifier to the unity gain setting when the current value of the signal strength metric is not substantially equal to the prior value of the signal strength metric.

The prior value of the signal strength metric may be determined when the first amplifier is set to unity gain and the current value of the signal strength metric may be determined when the first amplifier is set to fixed gain. Alternatively, the prior value of the signal strength metric may be determined when the first amplifier is set to fixed gain and the current value of the signal strength metric may be determined when the first amplifier is set to unity gain.

In some embodiments, the gain adjuster may be adapted to compare a current value of the threshold satisfaction metric with a prior value of the threshold satisfaction metric to determine whether the second amplifier should be set to the fixed gain setting. In particular, the gain adjuster may be adapted to set the second amplifier to the fixed gain setting when the current value of the threshold satisfaction metric is substantially equal to the prior value of the threshold satisfaction metric. Alternatively, the gain adjuster may be adapted to set the first amplifier to the unity gain setting when the current value of the threshold satisfaction metric is not substantially equal to the prior value of the threshold satisfaction metric. Further, the prior value of the threshold satisfaction metric may be determined when the first amplifier is set to unity gain and the current value of the threshold satisfaction metric may be determined when the first amplifier is set to fixed gain. Additionally, the prior value of the threshold satisfaction metric may be determined when the first amplifier is set to fixed gain and the current value of the threshold satisfaction metric may be determined when the first amplifier is set to unity gain.

According to a second aspect, the present invention may be embodied in an automatic gain control method for use with a receiver adapted to receive a broadcast signal having digital information encoded therein, the receiver may include a first amplifier having a fixed gain setting and a unity gain setting and a second amplifier cascaded with the first amplifier, wherein the second amplifier may have a variable gain. The method may include the steps of producing a first metric representative of a signal strength of the broadcast signal, producing an indicator signal representative of a magnitude of the digital information in comparison to a threshold, processing the indicator signal to determine a historical probability that the digital information exceeds the threshold to produce a second metric representative of an average signal strength of the signal and selectively switching the first amplifier between the fixed gain setting and the unity gain setting and varying the gain of the second amplifier based on the first metric and the second metric.

According to a third aspect, the present invention may be embodied in an automatic gain controller for use with a receiver having a processor, wherein the receiver may be adapted to receive a broadcast signal having digital information encoded therein. The receiver may include a first amplifier having a fixed gain setting and a unity gain setting and a second amplifier cascaded with the first amplifier, wherein the second amplifier may have a variable gain. In such an arrangement the automatic gain controller may include a memory communicatively coupled to the processor, a first routine stored on the memory for causing the processor to process the digital information to produce a signal strength metric representative of an average signal strength of the broadcast signal, a second routine stored on the memory for causing the processor to process the digital information to produce a threshold satisfaction indication representative of a magnitude of the digital information in comparison to a threshold, a third routine stored on the memory for causing the processor to process the threshold satisfaction indication to determine a historical probability that the digital information exceeds the threshold to produce a threshold satisfaction metric and a fourth routine stored on the memory for causing the processor to selectively switch the first amplifier between the fixed gain setting and the unity gain setting and to vary the gain of the second amplifier based on the signal strength metric and the threshold satisfaction metric.

These and other features of the present invention will be apparent to those of ordinary skill in the art in view of the description of the preferred embodiments, which is made with reference to the drawings, a brief description of which is provided below.

DESCRIPTION OF THE PREFERRED EMBODIMENTS

Figure 1:
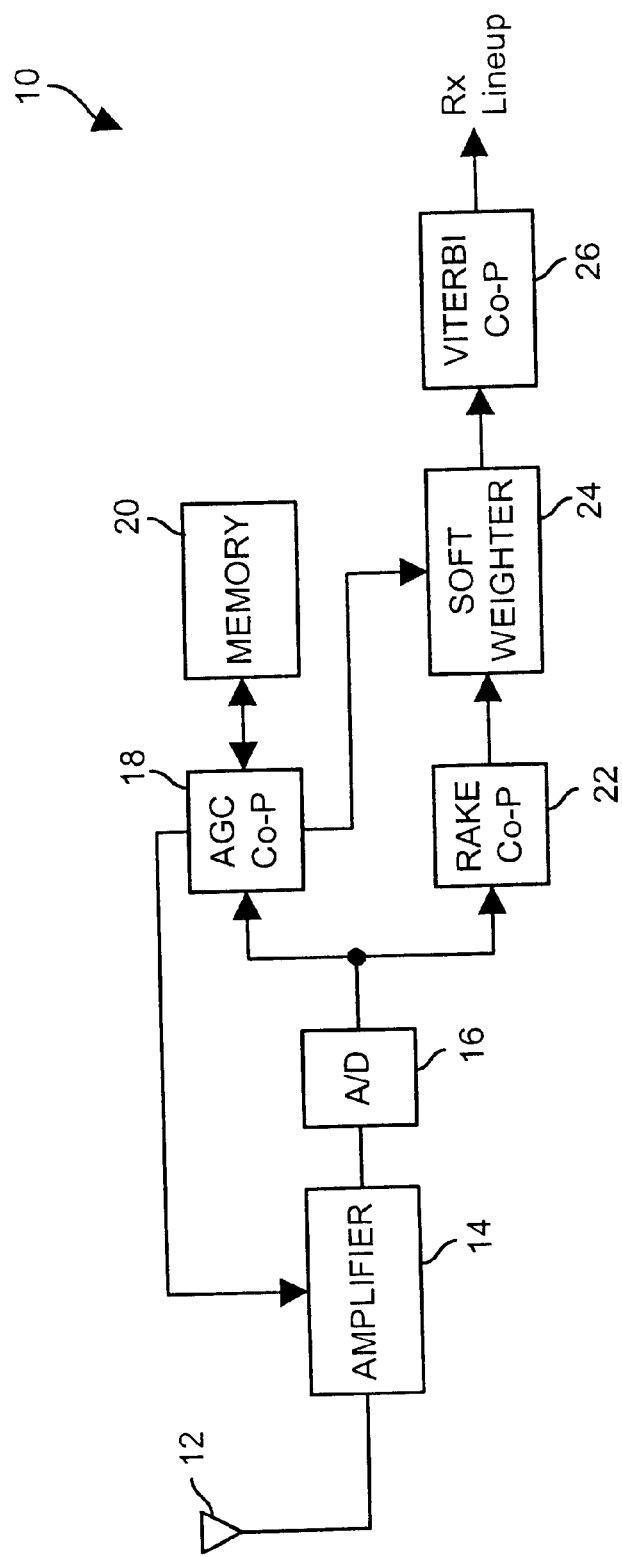
FIG. 1 is an exemplary block diagram of a receiver.

As shown in FIG. 1, a receiver 10 may include an antenna 12 and an amplifier 14 coupled to an analog-to-digital converter (hereinafter "A/D") 16, which is further coupled to an automatic gain controller co-processor (hereinafter "AGC") 18 having an associated memory 20 that may be integrated with the AGC 18. The memory 20 may be read only memory (ROM), random access memory (RAM) or any suitable combination thereof. The A/D 16 may be further coupled to a RAKE co-processor (hereinafter "RAKE") 22 that is coupled to a soft weighter 24, which also receives an input from the AGC 18, and has an output that is coupled to a viterbi co-processor 26. The viterbi co-processor 26 may be further coupled to a receiver lineup, which may include a vocoder or any other suitable voice or data processing hardware and/or software.

Although the receiver 10 processes both in-phase and quadrature components of a received signal, the following description does not distinguish therebetween. Accordingly, as will be appreciated by those having ordinary skill in the art, the processing and functionality shown and described in the accompanying figures and the specification may be implemented to operate on in-phase or quadrature signals or both.

In operation, analog radio frequency (RF) signals having digital information encoded thereon by a digital modulation scheme such as phase shift keying, or the like, are received by the antenna 12 and are coupled to the amplifier 14, where the RF signals are amplified to a desired level before being coupled to the A/D 16. Although not shown in FIG. 1, various downconverting and demodulating stages may be disposed between the antenna 12 and the A/D 16. The A/D 16 converts the received signals, which are in-phase or quadrature analog signals encoded with digital information, into digital signals that may be processed by a digital signal processor or any other suitable processing or logic device such as the AGC 18 or the RAKE 22. The output of the A/D 16, which may be bits, bytes or words representative of magnitudes of in-phase or quadrature components of a digital communication signal, is coupled to the AGC 18. The digital information output by the A/D 16 may be, for example, four bit words representative of in-phase or quadrature analog signals having magnitudes from, for example, −8 to +7. That is, the A/D 16 quantizes analog signals into 16 different levels and four bits may represent the level in which a particular signal falls.

Occasionally, due to input signals that are either too large or too small, an A/D may saturate. As referred to herein, when an A/D saturates, its output can go either no higher or no lower. For example, if an A/D has a minimum input of −10 volts (V), and for a −10V input the output of the A/D is −8, the A/D saturates if a −11 V signal is input to the A/D because the output of the A/D is −8 for a −11 V input signal. As a further example, an A/D that has a maximum output of +7 for a +10 V input signal would saturate at an output of +7 for any input larger than +10 V.

Figure 4:
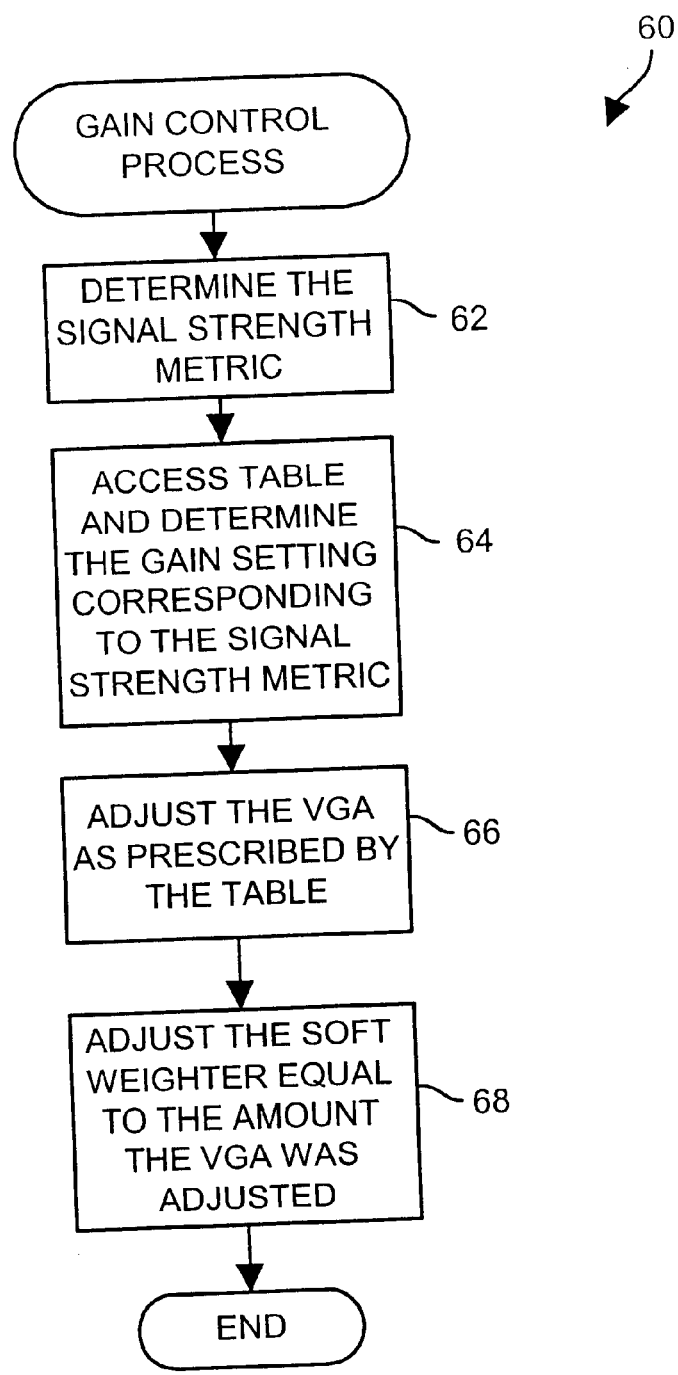
FIG. 4 is an exemplary flowchart representation of one embodiment of a gain control process that may be carried out by the automatic gain controller of FIG. 1.
Figure 5:
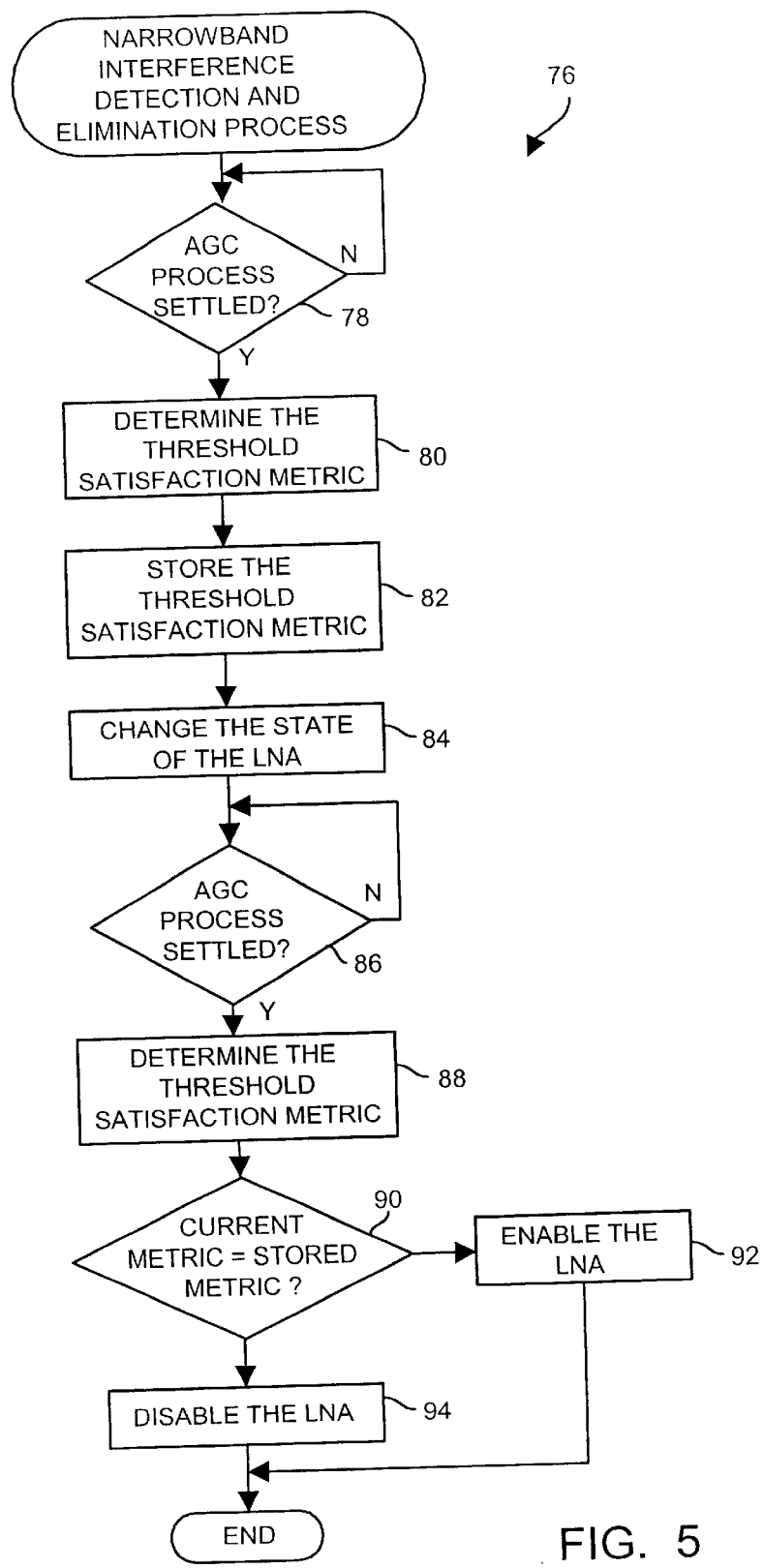
FIG. 5 is an exemplary flowchart representation of one embodiment of a narrowband interference detection and elimination process that may be carried out by the automatic gain controller of FIG. 1.
Figure 6:
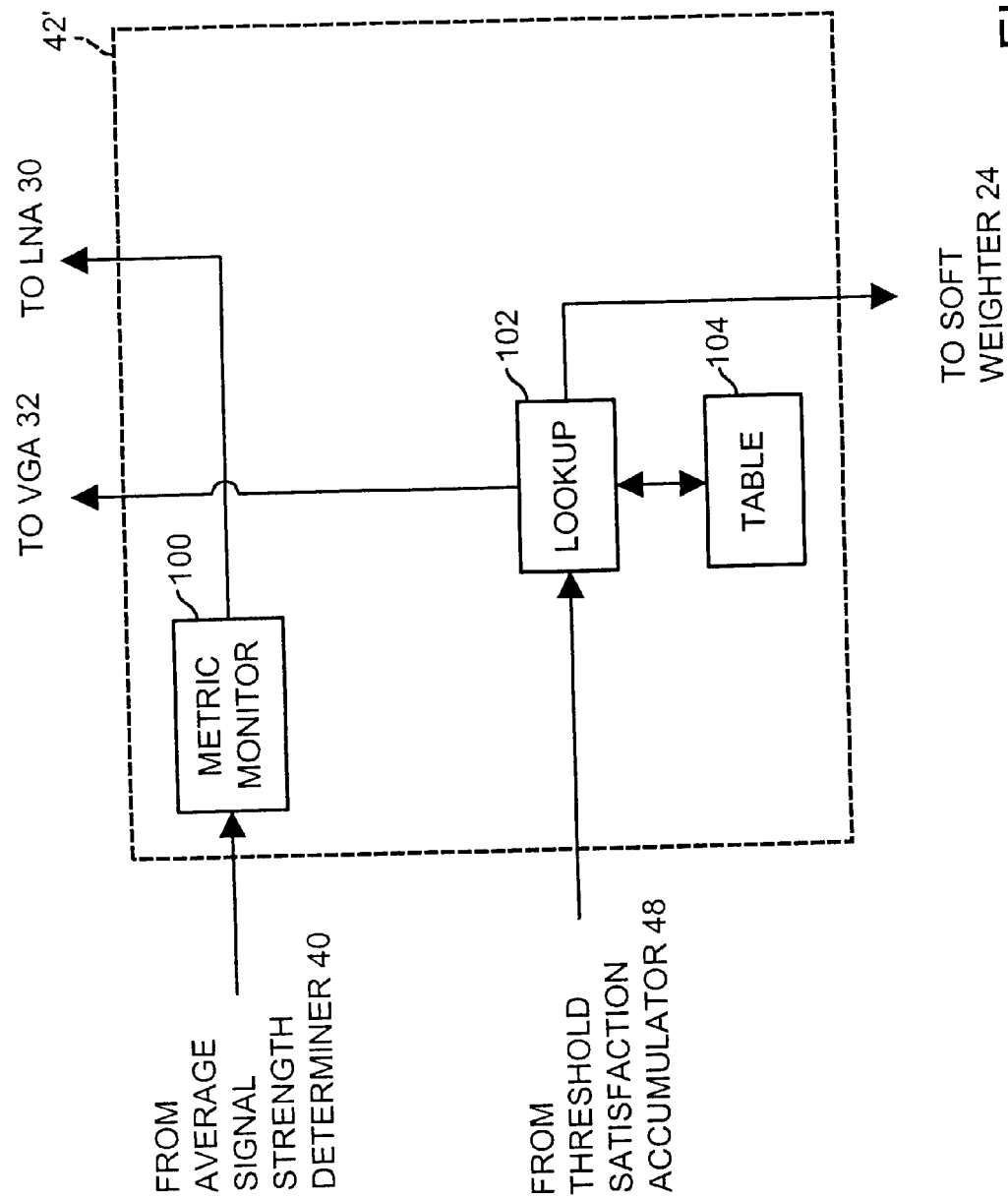
FIG. 6 is an exemplary block diagram showing details of a second embodiment of the gain adjuster of FIG. 2.

Of particular interest in FIG. 1 is the AGC 18 that operates based on instructions stored in the memory 20 to control the gain of the amplifier 14. A thorough description of the AGC 18 functionality, which may be implemented in hardware or software or some combination of hardware and software, is provided hereinafter in connection with FIGS. 2–8. In particular, FIGS. 2, 3 and 6 represent various functional elements of the AGC 18 and FIGS. 4, 5, 7 and 8 represent various processes that may be carried out by the AGC 18.

Returning to FIG. 1, the digital signals from the A/D 16 are also coupled to the RAKE 22, which, in a known manner, processes the digital signals by combining the digital signals with a pseudorandom code and by integrating and dumping the results of the combinations. The output of the RAKE 22 is coupled to the soft weighter 24, which is also communicatively coupled to the AGC 18. In a known manner, the soft weighter 24 modifies the output signal from the RAKE 22 in proportion to the amount the amplifier 14 is adjusted by the AGC 18. For example, if the AGC 18 increases the gain of the amplifier 14 by 3 decibels (dB), the soft weighter 24 must be informed of such an adjustment so that it can adjust the signal from the RAKE 22 to compensate for the increased gain of the amplifier 14. The compensation performed by the soft weighter 24 enables the viterbi co-processor 26 to appropriately generate confidence metrics to decode the digital signal produced by the RAKE 22.

As described in detail below, based on the digital information provided thereto, the AGC 18 increases or decreases the gain of the amplifier 14 to ensure high quality reception by the receiver 10. The amplifier 14 may include a low noise amplifier (LNA) and a variable gain amplifier (VGA). Because an LNA may be the source of narrowband interference, disabling the LNA will eliminate the narrowband interference that the LNA produces. However, disabling the LNA requires the VGA to replace the gain lost when the LNA is disabled. The use of the VGA to substitute for lost LNA gain increases current consumption of the receiver 10. A receiver operating in accordance with the present invention seeks to detect and eliminate narrowband interference, while using the LNA as often as possible to keep power consumption as low a possible. To this end, a receiver generates two metrics, one that is used to control the gain of the VGA and the other that is used to determine the presence of narrowband interference, such as IMD. The two metrics may represent A/D saturation and average signal strength, either of which may be used to control gain or to detect the presence of narrowband interference. The receiver 10 may detect narrowband interference by evaluating either one of the metrics when the LNA is enabled and when the LNA is disabled. If a metric changes significantly between when the LNA is enabled and when the LNA is disabled, narrowband interference caused by the LNA is likely present. Because the LNA is the suspected source of the narrowband interference, the LNA will then be disabled. Accordingly, in a receiver designed in accordance with the teaching of the present invention, the LNA is generally only disabled when it is the source of narrowband interference.

Figure 2:
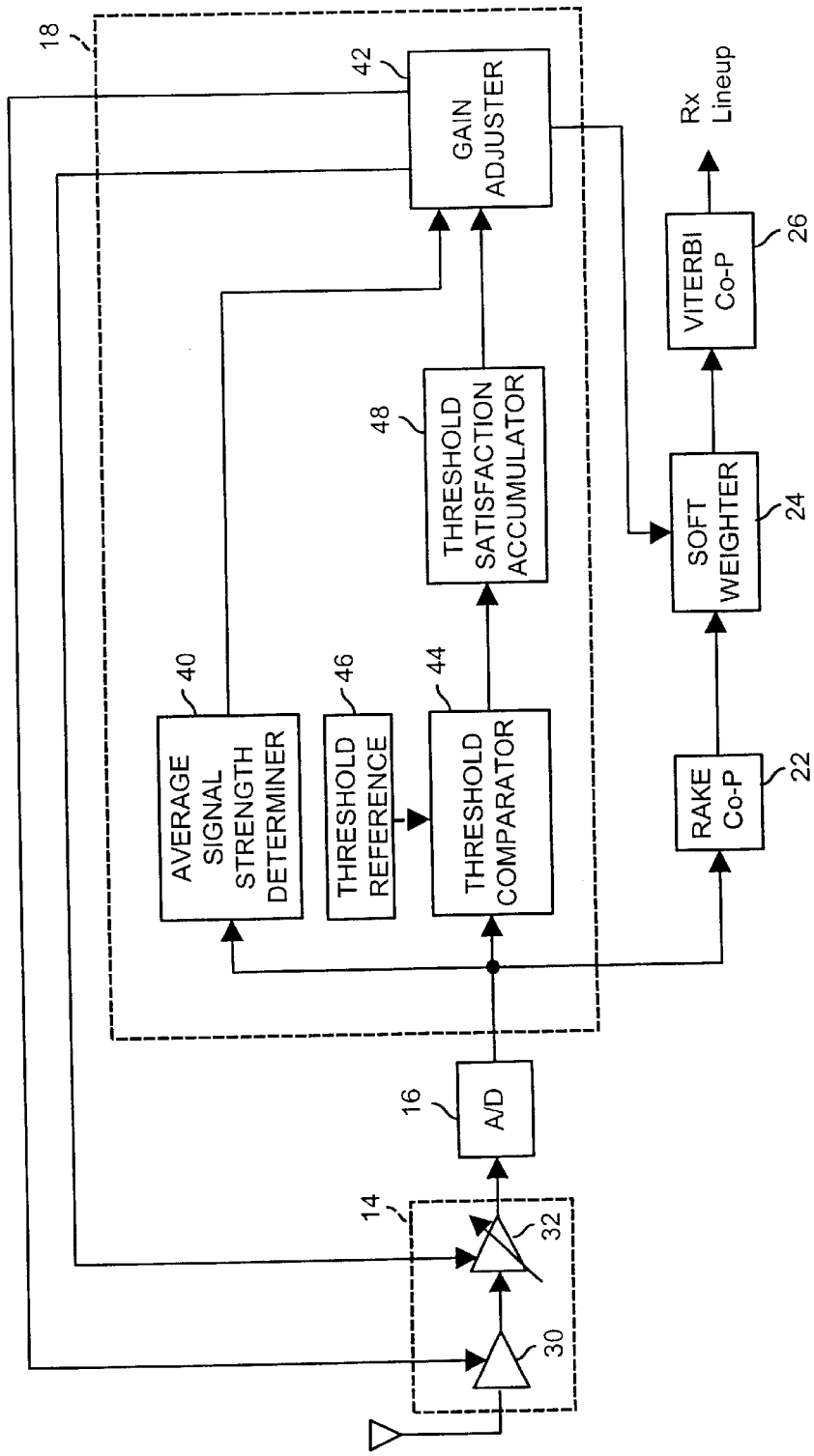
FIG. 2 is an exemplary block diagram of the receiver of FIG. 1 showing details of the functionality of the automatic gain controller co-processor.
Figure 3:
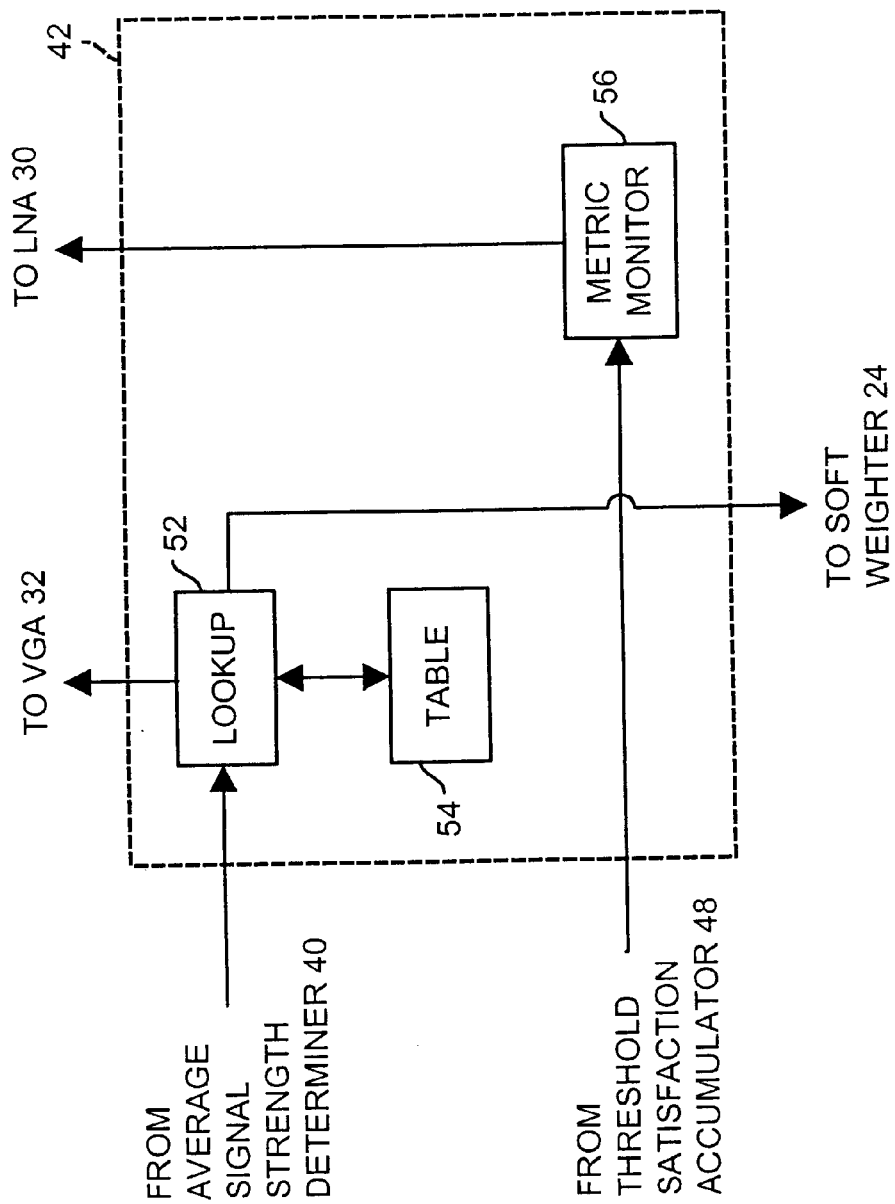
FIG. 3 is an exemplary block diagram showing details of one embodiment of the gain adjuster of FIG. 2.

Turning now to FIG. 2, the amplifier 14 may include a low power LNA 30 having a fixed non-unity gain. The LNA 30 may be selectively enabled and disabled by the AGC 18. As used herein, the terms enabled and disabled refer to setting the gain of the LNA 30 between a fixed gain setting (enabled) and a unity gain setting (disabled). The amplifier 14 may also include a VGA 32, the gain of which may be adjusted by the AGC 18. As also shown in FIG. 2, the AGC 18 may include an average signal strength determiner 40 that is coupled to a gain adjuster 42. The AGC 18 may also include a threshold comparator 44 that is coupled to a threshold reference 46. The output of the threshold comparator 44 is coupled to a threshold satisfaction accumulator 48, which is further coupled to the gain adjuster 42. While the AGC 18 is described herein as including elements 40–48, those having ordinary skill in the art will readily appreciate that such elements could be implemented in other manners than on the AGC 18. For example, hardware elements that embody the functionality of elements 40–48 may be implemented in an application specific integrated circuit (ASIC) or any other suitable logic device.

During operation of the AGC 18, the average signal strength determiner 40 calculates a signal strength metric representative of the average strength of the signal received at the antenna 12. The signal strength metric is calculated based on the output signals from the A/D 16. In particular, the average signal strength determiner 40 may calculate the signal strength metric using any one of the signal strength metric equations 1–3 below, or any other suitable averaging equation.

$$\text{Signal Strength Metric} = \frac{1}{n}\sum_{n} |A/D \text{ Output}| \qquad \text{Equation 1}$$

$$\text{Signal Strength Metric} = \frac{1}{n}\sum_{n} |A/D \text{ Output}|^2 \qquad \text{Equation 2}$$

-continued $$\text{Signal Strength Metric} = \frac{1}{n}\sum_n (A/D \text{ Output})^2 \quad \text{Equation 3}$$

Optionally, the $$\frac{1}{n}$$

scaling factor shown in equations 1–3 may be omitted in the calculation of the signal strength metric. The variable "A/D Output" shown in equations 1–3 below represents magnitudes produced by the A/D 16, which may have four bit digital values ranging from −8 to +7 or may have any other suitable range. The signal strength metrics shown in equations 1–3 may be computed over a number of words or over a fixed period of time. For example, the averages may be calculated over 24 symbols, wherein each symbol is represented by 64 chips, all of which corresponds to averaging over 12288 words using 8 times oversampling per chip. Alternatively, the signal strength metric may be calculated every 1.25 milliseconds (ms), which corresponds to a rate of 800 hertz (Hz).

During normal operation, which is defined herein as 0 dB SNR, the amplifier 14 gain properly adjusted and no narrowband interference present, a signal strength metric calculated according to equation will nominally have a value of 3. No matter which equation is used to determine the signal strength metric, changes in the magnitude of the signal strength metric may be used to detect the presence of narrowband interference or to control the gain of the amplifier 14.

Returning to FIG. 2, within the AGC 18, the output of the A/D 16 is also coupled to the threshold comparator 44 that compares the A/D output to the threshold reference 46. Although the threshold reference 46 may be set to many different levels, desirable settings may include the high and/or low saturation output levels of the A/D 16 (i.e., −8 and/or +7). Setting the threshold reference 46 to −8 and +7 allows the threshold comparator 44 to detect each time the A/D 16 saturates due to an input signal having an amplitude that is either too large or too small for the A/D 16. When the A/D output meets or exceeds the threshold reference 46, the threshold comparator 44 generates an output signal that is coupled to the threshold satisfaction accumulator 48. For example, if a threshold is set at +7, each time the A/D 16 outputs a +7 the threshold comparator 44 may produce a logical one that is coupled to the threshold satisfaction accumulator 48.

The threshold accumulator 48 generates a threshold satisfaction metric indicative of how frequently the output from the A/D 16 satisfies the threshold reference 46 (e.g., how often the A/D 16 saturates), by tracking how often the threshold comparator 44 indicates that the threshold reference 46 has been satisfied to determine a historical probability that the A/D 16 saturated. For example, the threshold satisfaction accumulator 48 may track or count the number of times the threshold comparator 44 produced a logical one output versus the number of opportunities there were for the threshold satisfaction accumulator 48 to produce a logical one. In practice, the threshold satisfaction accumulator 48 keeps a running average of the percentage of the time that the threshold reference 46 has been satisfied, thereby generating a threshold satisfaction metric. Generally, the A/D 16 may be saturated approximately 3% of the time during normal operation with the gain of the amplifier set and roughly 0 dB signal-to-noise ratio, which, as noted previously, may be considered to be normal operating conditions of the receiver 10. As will be explained below in detail, a significant increase or decrease in the percentage of time that saturation occurs may be used by the gain adjuster 42 to detect the presence of narrowband interference. Additionally, percent saturation may be used to control the gain of the amplifier 14 as described in further detail below with respect to FIGS. 6–8. Further, as will be appreciated by those having ordinary skill in the art, the signal-to-noise ratio may be determined by comparing the RAKE 22 input, which contains signal and noise, to the RAKE 22 output, which contains only signal.

Of particular interest in FIG. 2, is the gain adjuster 42, which uses the signal strength metric from the average signal strength determiner 40 and the threshold satisfaction metric from the threshold satisfaction accumulator 48 to control the LNA 30 and the gain of the VGA 32 and to detect the presence of narrowband interference. In particular, the gain adjuster 42 controls the VGA 32 to automatically control the gain of the amplifier 14 and controls the LNA 30 to eliminate or minimize narrowband interference. The narrowband interference functionality of the gain adjustor 42 should be substantially synchronized with the automatic gain control functionality of the gain adjustor 42. Accordingly, gain adjustments and narrowband interference detection should take place at approximately the same instances in time. For example, automatic gain control may be carried out every 1.25 ms and narrowband interference detection may be carried out once per second, wherein the times at which the narrowband interference detection is carried out correspond to the times at which the automatic gain control is carried out. Further detail regarding the operation of the gain adjuster 42 is provided below in connection with FIGS. 3 and 6.

As shown in FIG. 3, the gain adjuster 42 may include a lookup function 52, a lookup table 54 and a metric monitor 56. The lookup function 52 receives the signal strength metric produced by the average signal strength determiner 40 and uses the lookup table 54 to determine if the gain of the VGA 32 should be increased or decreased. Based on the information stored in the lookup table 54, the lookup function 52 appropriately increases or decreases the gain of the VGA 32 based on the signal strength metric provided by the signal strength determiner 40. The lookup function 52 must inform the soft weighter 24 of any gain adjustments made to the VGA 32. For example, if the lookup function 52 increases the gain of the VGA 32 by 3 dB, the lookup function 52 must inform the soft weighter 24 of the 3 dB increase so that the soft weighter 24 may compensate for the 3 dB increase to keep the viterbi decoding performed by the viterbi co-processor 26 from being adversely affected by the increase in gain at the VGA 32. Thus, the signal strength metric is used to control the gain of the VGA 32. An exemplary lookup table 54 is shown below as Table 1.

TABLE 1

| Signal Strength Metric | dB Correction of the VGA 32 |
| --- | --- |
| ≈1.5 | +6 |
| ≈1.69 | +5 |
| ≈1.89 | +4 |
| ≈2.12 | +3 |
| ≈2.38 | +2 |
| ≈2.67 | +1 |
| ≈3.00 | 0 |
| ≈3.37 | −1 |

TABLE 1-continued

| Signal Strength Metric | dB Correction of the VGA 32 |
|---|---|
| ≈3.78 | −2 |
| ≈4.24 | −3 |
| ≈4.75 | −4 |
| ≈5.33 | −5 |
| ≈5.99 | −6 |

For example, referring to Table 1, if the signal strength metric is roughly 1.5, the gain of the VGA 32 is too low and, therefore, the gain of the VGA 32 must be increased by 6 dB. Conversely, if the signal strength metric is roughly 5.99, the gain of the VGA 32 is too high and, therefore, the gain of the VGA 32 must be decreased by 6 dB.

Generally, the metric monitor 56 evaluates the output of the threshold satisfaction accumulator 48 to determine if narrowband interference is present in the received signal. In particular, the metric monitor 56 expects the threshold satisfaction accumulator 48 to indicate that the threshold reference 46 is satisfied (i.e., the A/D 16 is saturated) approximately 1.5% of the time. When the threshold satisfied accumulator 48 indicates that the A/D 16 is saturating more or less than a range around 1.5% (e.g., roughly 0.5% to 3.5%) in a 0 dB signal-to-noise situation, narrowband interference may be present.

The metric monitor 56 determines that narrowband interference may be present by storing the current state of the threshold satisfaction metric produced by the threshold satisfaction accumulator 48 before disabling the LNA 30. If the narrowband interference is due to the LNA 30, disabling the LNA 30 will eliminate the narrowband interference caused thereby. After the LNA 30 is disabled, the signal strength metric is processed by the lookup function 52 to control the gain of the VGA 32 to compensate for the gain that was lost when the LNA 30 was disabled. After the signal strength metric has stabilized (i.e., the gain of the VGA 32 is no longer being adjusted to compensate for the gain that was lost by disabling of the LNA 30), the metric monitor 56 checks the state of the threshold satisfaction metric from the threshold satisfaction accumulator 48. The metric monitor 56 then compares the current state of the threshold satisfaction metric with the stored state of the threshold satisfaction metric to determine if narrowband interference is present. If the current threshold satisfaction metric is different than the stored threshold satisfaction metric, it is likely that narrowband interference is present because narrowband interference causes the threshold satisfaction metric to change. Accordingly, if the stored threshold satisfaction metric is different than the current threshold satisfaction metric, the metric monitor 56 determines that narrowband interference caused by the LNA 30 is present and, therefore, keeps the LNA 30 disabled. If, however, disabling the LNA 30 does not affect the threshold satisfaction metric (i.e., the stored threshold satisfaction metric is the same as the current threshold satisfaction metric), the metric monitor determines that narrowband interference is not present and, therefore, enables the LNA 30. After the LNA 30 is enabled, the gain of the VGA 32 is decreased to compensate for the LNA 30 being enabled. Accordingly, the LNA 30 is only disabled when it is the source of narrowband interference and is enabled otherwise.

While the foregoing description accompanying FIGS. 2 and 3 describes the elements therein as being hardware blocks that may be embodied in logic circuits such as ASICs or the like, those having ordinary skill in the art will readily recognize that such functions may be carried out using software or any suitable combination of hardware and software. Accordingly, the functionality described in connection with FIGS. 2 and 3 is not limited to being implemented using purely hardware or purely software.

Referring back to FIG. 1, the functionality of the AGC 18 may be controlled by instructions stored in the memory 20. The processes shown in FIGS. 4 and 5 represent the functionality that such instructions or routines may embody. For example, software routines or instructions written in a suitable computer language may be compiled into a form that is stored in the memory 20 and executed by the AGC 18 to carry out the functions shown in the blocks of FIGS. 4 and 5. As will be appreciated by those having ordinary skill in the art, certain of the blocks of the processes shown in FIGS. 4 and 5 may be executed by the AGC 18 in an order other than that shown in FIGS. 4 and 5. Accordingly, the processes shown in FIGS. 4 and 5 are merely exemplary of the functionality that may be carried out by the AGC 18 to control amplifier gain and to detect narrowband interference. Additionally, the process shown in FIGS. 4 and 5 should be substantially synchronized such that the process shown in FIG. 5 executes when the process shown in FIG. 4 executes so that changes made to the gain of the LNA 30 occur at substantially the same time as the gain of the VGA 32 is adjusted.

Turning now to FIG. 4, a gain control process 60, which may be carried out by routines executed by the AGC 18 (FIG. 1) controls the gain of the VGA 32 based on the value of the signal strength metric. Execution of the process 60 begins at a block 62 where the AGC 18 determines the signal strength metric, which represents the average signal strength of the signal received by the antenna 12 (FIG. 1). As noted above with respect to the signal strength determiner 40 (FIG. 2) and as shown in equations 1–3, the block 62 may determine the signal strength metric by averaging the A/D 16 output over a period of time or over a number of samples or words. After the block 62 determines the signal strength metric, control passes to a block 64, which accesses a lookup table to determine a gain setting for the VGA 32 (FIG. 2) based on the signal strength metric. The functionality of the block 64 is similar to the functionality described in connection with elements 52 and 54 and Table 1 described in connection with FIG. 3.

After the block 64 has determined the appropriate gain setting for the VGA 32 based on the signal strength metric, control passes to a block 66. The block 66 adjusts the gain of the VGA 32 as prescribed by the block 64. For example, if the block 64 dictates that the gain of VGA 32 should be increased by 3 dB, the block 66 programs the VGA 32 to increase its gain by 3 dB. After the block 66 executes, a block 68 adjusts the soft weighter 24 (FIG. 2) by an amount equal to the amount by which the VGA 32 was adjusted. For example, if the gain of the VGA 32 was increased by 3 dB, the block 68 informs the soft weighter 24 of such an adjustment so that the soft weighter 24 may compensate for the increased VGA gain to keep the confidence metrics produced by the viterbi co-processor accurate in spite of the increased gain of the VGA 32.

The gain control process 60 as described in FIG. 4 may be executed frequently (e.g., every 1.25 ms, which corresponds to an 800 Hz rate) to automatically adjust the gain of the VGA 32 as the receiver 10 operates. Automatic adjustment of the VGA 32 ensures that the RAKE 22 and any other signal processing components will process the signals received by the antenna 12 as accurately as possible.

The theory behind the operation of a narrowband interference detection and elimination process 76, as shown in FIG. 5, is that the LNA 32 (FIG. 2) should be used as often as possible to conserve battery life, but should not be used when if contributes narrowband interference. The process 76 uses the threshold satisfaction to determine if narrowband interference is present. The process 76 may be carried out once per second or at any other suitable rate.

The process 76 begins operation at a block 78 where the process 76 determines if the gain control process 60 has stabilized. One technique for determining if the process 60 has stabilized is to monitor the number and magnitude of gain adjustments that have been made to the VGA 32 over a fixed period of time. When the number and magnitude of gain adjustments to the VGA 32 have decreased, the process 60 has stabilized. The execution of the process 76 remains at the block 78 as long as the process 60 has not stabilized. After the process 76 has stabilized, control passes from the block 78 to a block 80.

The block 80 determines the value of the threshold satisfaction metric that represents the percentage of time the A/D 16 (FIG. 2) is saturated. The block 80 determines the value of the threshold satisfaction metric by determining the percentage of time a threshold is satisfied. Because narrowband interference likely affects how often the A/D 16 (FIG. 2) saturates, if the threshold is set at the saturation points of the A/D 16 (e.g., −8 and +7), the block 80 will be able to determine the presence of narrowband interference because the threshold will be met, or satisfied, more or less often when narrowband interference is present. Accordingly, the presence of narrowband interference results in a threshold satisfaction metric having a different value than when narrowband interference is not present. The functionality described in connection with the block 80 corresponds to the elements 44–48 described in connection with FIG. 2. After the block 80 determines a value for the threshold satisfaction metric, control passes to a block 82, which stores the threshold satisfaction metric.

After the block 82 has stored a first threshold satisfaction metric, control passes to a block 84, which changes the state of the LNA 32 (FIG. 2). For example, if the LNA 32 is enabled prior to the execution of the block 84, the block 84 will disable the LNA 32. Conversely, if the LNA 32 is disabled prior to the execution of the block 84, the block 84 will enable the LNA 32. After the state of the LNA 32 has been changed, control passes to a block 86, which, like the block 78 described above, determines if the process 60 has settled. As long as the process 60 has not settled, control remains at the block 86. However, when the process 60 settles, control passes from the block 86 to a block 88.

The block 88, like the block 80, determines a threshold satisfaction metric representing how often the threshold is satisfied (i.e., how often the A/D 16 is saturated), before passing control to a block 90. The block 90 compares the threshold satisfaction metrics produced by the blocks 80 and 88. If the threshold satisfaction metrics are the same, or are substantially similar, control passes from the block 90 to a block 92, which enables the LNA 32 before ending execution of the process 76. The block 92 enables the LNA 32 because the LNA 32 does not affect the threshold satisfaction metric and, therefore, cannot be the source of narrowband interference.

If, however, the block 90 determines that the threshold satisfaction metrics produced by the blocks 80 and 88 are different, or not substantially similar, control passes from the block 90 to a block 94, which disables the LNA 32. The block 94 disables the LNA 32 because the block 90 has determined that the threshold satisfaction metrics are not substantially similar and, therefore, the LNA 32 must be the source of narrowband interference. Accordingly, to eliminate the narrowband interference, the block 94 disables the LNA 32.

While the foregoing description of FIGS. 3–5 discloses using the signal strength metric for gain control and using the threshold satisfaction metric for narrowband interference detection and elimination, FIGS. 6–8, as described below, disclose using the threshold satisfaction metric for gain control and using the signal strength metric for narrowband interference detection and elimination. As disclosed herein, either of the signal strength metric and the threshold satisfaction metric may be used for gain control, while the metric that is not used for gain control may be used for narrowband interference detection and elimination.

Turning now to FIG. 6, an alternate embodiment of the gain adjuster 42' includes a metric monitor 100, a lookup function 102 and a lookup table 104. The metric monitor 100 receives the signal strength metric from the average signal strength determiner 40, while the lookup function 102 receives the threshold satisfaction metric from the threshold satisfaction accumulator 48. Based on the threshold satisfaction metric and the signal strength metric the gain adjuster 42' shown in FIG. 6 controls the VGA 32 and the LNA 30, respectively.

In particular, the lookup function 102 compares the threshold satisfaction metric to information stored in the lookup table 104. Ideally, the threshold satisfaction metric may have a value of, for example, 1.5% and, when the threshold satisfaction metric is not at the ideal value, the gain of the VGA 32 (FIG. 2) is adjusted to bring the threshold satisfaction metric closer to the ideal value. In practice, the lookup table 104 may store several threshold satisfaction metric data points and the gains to which the VGA 32 should be set to bring the threshold satisfaction metric closer to the ideal value of 1.5%. Alternatively, as shown in Table 2, a range of satisfaction metrics may correspond to particular gain adjustments. For example, as shown in Table 2, when the threshold satisfaction metric is less than 1.5%, the gain of the VGA 32 should be increased by 1 dB. Accordingly, through numerous iterations of the lookup function 104, the gain of the VGA 32 will be adjusted until 1.5% saturation is reached.

TABLE 2

| Threshold Satisfaction Metric | dB Correction of the VGA 32 |
| --- | --- |
| <1.5% | +1 dB |
| ≈1.5% | 0 dB |
| >1.5% | −1 dB |

Additionally, as described in connection with FIG. 3, when the gain of the VGA 32 is adjusted, the soft weighter 24 needs to be adjusted to allow the viterbi co-processor 26 (FIG. 2) to decode the digital information in the signal received by the antenna 12 in a proper manner. Accordingly, the gain of the VGA 32 is controlled by the threshold satisfaction metric.

The metric monitor 100, which receives the signal strength metric, compares two signal strength metrics, one that was calculated while the LNA 30 was in use and one that was calculated while the LNA 30 was not in use. If the two signal strength metrics are substantially similar, narrowband interference is not likely present, because narrowband interference tends to affect the magnitude of the signal strength metric. If the two signal strength metrics are not substantially similar, it is likely due to the presence of narrowband interference. Accordingly, if the two signal strength metrics are substantially similar, the metric monitor 100 will enable the LNA 30 and, if the two signal strength metrics are not substantially similar, the metric monitor 100 will disable the LNA 30 because the LNA 30 is likely the source of narrowband interference.

In operation, the metric monitor 100 stores the value of the signal strength metric from the signal strength determiner 40 while the LNA 30 is enabled and then disables the LNA 30. While the LNA 30 is disabled, the metric monitor 100 reads the value of the signal strength metric from the signal strength determiner 40 and compares the latest signal strength metric with the stored signal strength metric. As described above, based on the results of the comparison of the signal strength metrics, the metric monitor 100 enables or disables the LNA 30.

Figure 7:
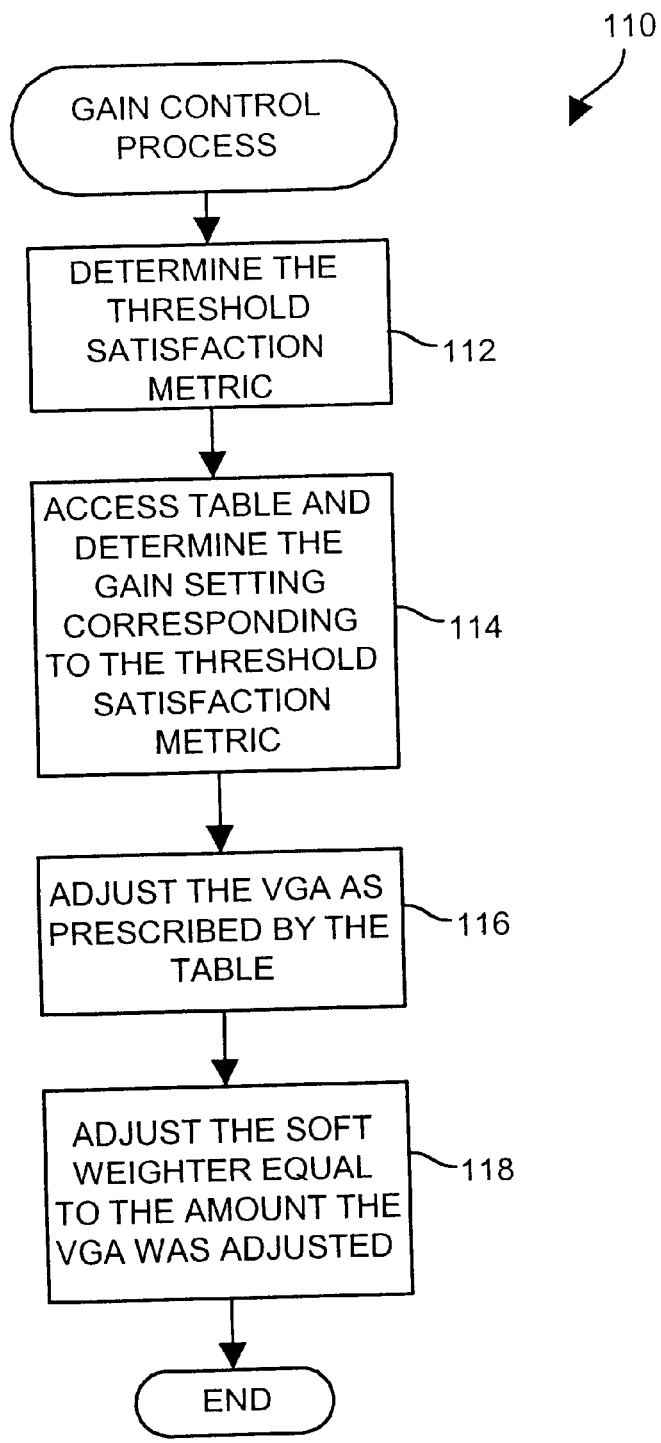
FIG. 7 is an exemplary flowchart representation of a second embodiment of a gain control process that may be carried out by the automatic gain controller of FIG. 1.

Turning now to FIG. 7, an alternate gain control process 110 includes numerous blocks representing functions, which may be stored in the memory 20 in the form of instructions or routines that are carried out or executed by the AGC 18 (FIG. 1). The process 110 begins at a block 112 where the AGC 18 determines a threshold satisfaction metric representative of how often the threshold is satisfied. Such a determination may be made in a manner that is described in connection with elements 44–48 of FIG. 2. Generally speaking, the determination is made by comparing the average signal strength of the signal received by the antenna 12 (FIG. 1) to a threshold. As noted above with respect to the signal strength determiner 40 (FIG. 2), the signal strength may be determined by averaging the A/D 16 output over a period of time or over a number of samples using, for example, equations 1–3.

After the block 112 has determined the signal strength metric, control passes to a block 114, which accesses a lookup table to determine a gain setting for the VGA 32 (FIG. 2) based on the signal strength metric. The execution of this block is similar to the functionality described in connection with elements 102 and 104 and Table 2, described in connection with FIG. 6.

After the block 114 has determined the gain setting corresponding to the threshold satisfaction metric, control passes to a block 116, which adjusts the gain of the VGA 32 as prescribed by the block 114. A block 118 adjusts the soft weighter 24 (FIG. 2) by an amount based on the amount by which the VGA 32 was adjusted. For example, if the gain of the VGA 32 was increased by 3 dB, the block 118 informs the soft weighter 24 of such an adjustment so that the soft weighter 24 may compensate for the increased VGA gain to keep the confidence metrics produced by the viterbi co-processor consistent in spite of the increased gain of the VGA 32.

The gain control process 110 as described in connection with FIG. 7 may be executed frequently (e.g., every 1.25 ms) to automatically adjust the gain of the VGA 32 as the receiver 10 operates. Automatic adjustment of the VGA 32 ensures that the RAKE 22 and any other signal processing components will process the signals received by the antenna 12 as accurately as possible.

Figure 8:
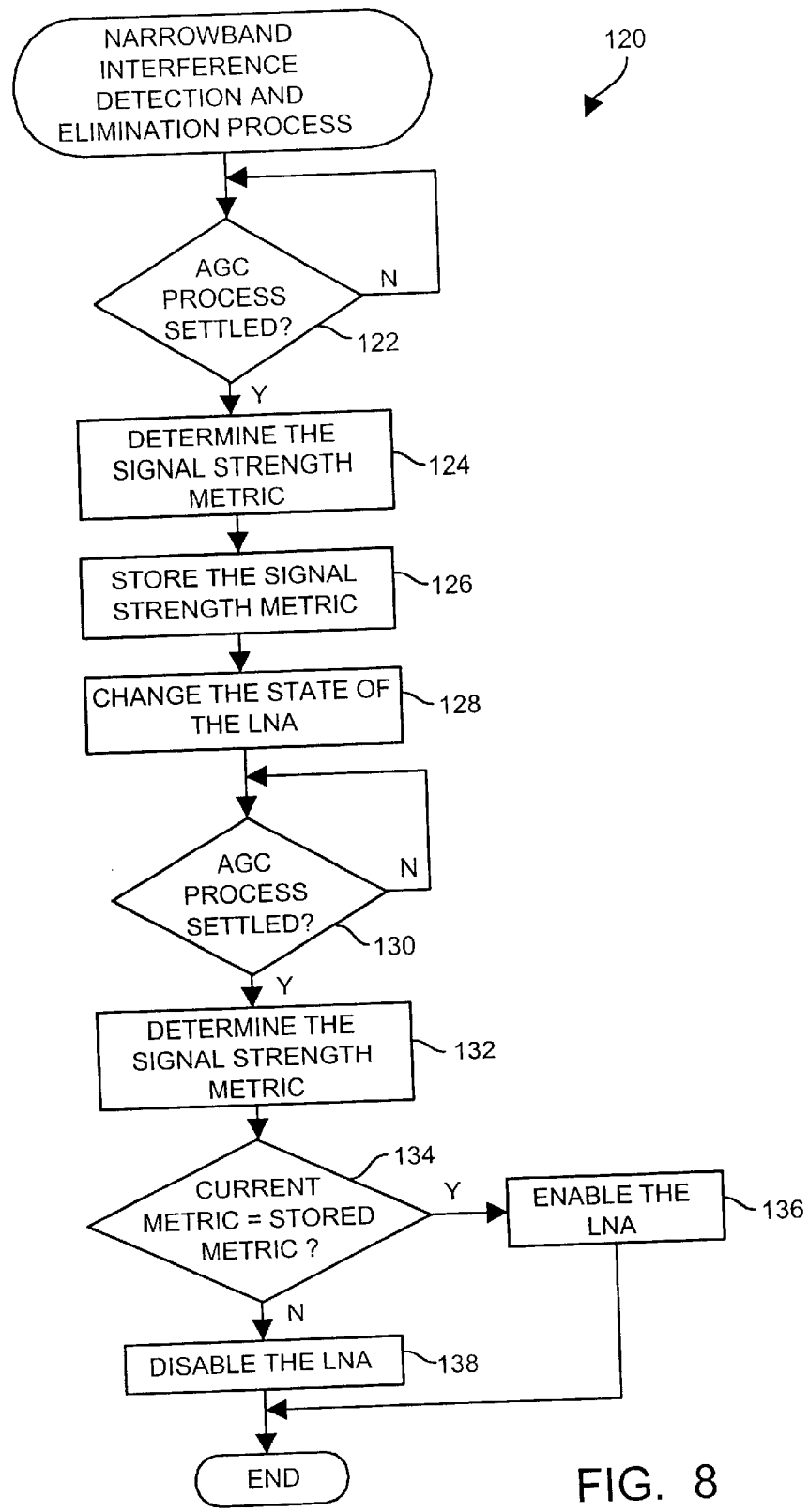
FIG. 8 is an exemplary flowchart representation of a second embodiment of a narrowband interference detection and elimination process that may be carried out by the automatic gain controller of FIG. 1.

As with the process 76 (FIG. 5), the theory behind the operation of a narrowband interference detection and elimination process 120, as shown in FIG. 8, is that the LNA 32 (FIG. 2) should be used as often as possible to conserve battery life, but should not be used when it contributes narrowband interference. The process 120 uses the signal strength metric to determine if narrowband interference is present. The process 120 may be carried out once per second or at any other suitable rate.

The process 120, which is represented in FIG. 8 by various blocks or functions that may be stored in the memory 20 in the form of routines or instructions that are carried out by the AGC 18, begins operation at a block 122 where the process 120 determines if the gain control process 110 has stabilized. As noted previously, one technique for determining if the process 110 has stabilized is to monitor the number of gain adjustments that have been made to the VGA 32 over a fixed period of time. When the number and magnitude of the gain adjustment to the VGA 32 has decreased, the process 110 has stabilized. The execution of the process 120 remains at the block 122 as long as the process 110 has not stabilized. After the process 110 has stabilized, control passes from the block 122 to a block 124.

The block 124 determines the value of the signal strength metric that represents the average signal strength of the signals received at the antenna 12. The block 124 may determine the value of the signal strength metric through the use of equations 1–3 above or through the use of any other suitable equations. Because narrowband interference likely affects the value of the signal strength metric, a comparison of two signal strength metrics will likely reveal if narrowband interference is present. The functionality described in connection with the block 124 corresponds to the element 40 of FIG. 2. After the block 124 determines a value of the signal strength metric, control passes to a block 126, which stores the signal strength metric.

After the block 126 has stored a first signal strength metric, control passes to a block 128, which changes the state of the LNA 32 (FIG. 2). For example, if the LNA 32 is enabled prior to the execution of the block 128, the block 128 will disable the LNA 32. Conversely, if the LNA 32 is disabled prior to the execution of the block 128, the block 128 will enable the LNA 32. After the state of the LNA 32 has been changed, control passes to a block 130, which, like the block 122, determines if the process 110 has settled. As long as the process 110 has not settled, control remains at the block 130. However, when the process 110 settles, control passes from the block 130 to a block 132.

The block 132, like the block 124, determines a signal strength metric representing average signal strength of the signal received at the antenna 12, before passing control to a block 134. The block 134 compares the signal strength metrics produced by the blocks 124 and 132. If the signal strength metrics are the same, or substantially similar, control passes from the block 134 to a block 136, which enables the LNA 32 before ending execution of the process 120. The block 136 enables the LNA 32 because the LNA 32 does not affect the signal strength metric and, therefore, is not the source of narrowband interference.

If, however, the block 134 determines that the signal strength metrics produced by the blocks 124 and 132 are different, or not substantially similar, control passes from the block 134 to a block 138, which disables the LNA 32. The block 138 disables the LNA 32 because the block 134 has determined that the signal strength metrics are not substantially similar and, therefore, the LNA 32 must be the source of narrowband interference. Accordingly, to eliminate the narrowband interference, the block 138 disables the LNA 32.

As disclosed herein, the selective enabling and disabling of the LNA 30 depending on the presence of narrowband interference allows the receiver 10 to eliminate narrowband interference when it is caused by the LNA 30, while conserving battery life by using the LNA 30 when it is not the source of narrowband interference.

Numerous modifications and alternative embodiments of the invention will be apparent to those skilled in the art in view of the foregoing description. For example, the data shown in Tables 1 and 2 are merely exemplary and those having ordinary skill in the art would readily appreciate that such data could be easily changed to enable operation of the present invention in a wide range of different systems. Accordingly, this description is to be construed as illustrative only and not as limiting to the scope of the invention. The details of the structure may be varied substantially without departing from the spirit of the invention, and the exclusive use of all modifications, which are within the scope of the appended claims, is reserved.

It is claimed:

1. An automatic gain controller for use with a receiver adapted to receive a broadcast signal having digital information encoded therein, the receiver including a first amplifier having a fixed gain setting and a unity gain setting, a second amplifier cascaded with the first amplifier, the second amplifier having a variable gain, the automatic gain controller comprising:

a signal strength determiner adapted to process the digital information to produce a signal strength metric representative of an average signal strength of the broadcast signal;

a threshold comparator adapted to process the digital information to produce a threshold satisfaction indication representative of a magnitude of the digital information in comparison to a threshold;

an accumulator communicatively coupled to the threshold comparator and adapted to process the threshold satisfaction indication to determine a historical probability that the digital information exceeds the threshold to produce a threshold satisfaction metric; and a gain adjuster communicatively coupled to the signal strength determiner, the accumulator, the first amplifier and the second amplifier, the gain adjuster adapted to selectively switch the first amplifier between the fixed gain setting and the unity gain setting and to vary the gain of the second amplifier based on the signal strength metric and the threshold satisfaction metric, wherein the gain adjuster is adapted to compare a current value of the signal strength metric with a prior value of the signal strength metric to determine whether the first amplifier should be set to the fixed gain setting and is further adapted to set the first amplifier to the fixed gain setting when the current value of the signal strength metric is substantially equal to the prior value of the signal strength metric.

2. The automatic gain controller of claim 1, wherein the signal strength determiner processes the digital information by summing a number of absolute values of analog signal levels represented by the digital information and dividing the sum by the number of absolute values over which the sum was taken to produce the signal strength metric.

3. The automatic gain controller of claim 1, wherein the signal strength determiner processes the digital information by summing a number of squared values of analog signal levels represented by the digital information and dividing the sum by the number of squared values over which the sum was taken to produce the signal strength metric.

4. The automatic gain controller of claim 1, wherein the signal strength determiner processes the digital information by summing a number of squared absolute values of analog signal levels represented by the digital information and dividing the sum by the number of squared absolute values over which the sum was taken to produce the signal strength metric.

5. An automatic gain controller for use with a receiver adapted to receive a broadcast signal having digital information encoded therein, the receiver including a first amplifier having a fixed gain setting and a unity gain setting, a second amplifier cascaded with the first amplifier, the second amplifier having a variable gain, the automatic gain controller comprising:

a signal strength determiner adapted to process the digital information to produce a signal strength metric representative of an average signal strength of the broadcast signal a threshold comparator adapted to process the digital information to produce a threshold satisfaction indication representative of a magnitude of the digital information in comparison to a threshold;

an accumulator communicatively coupled to the threshold comparator and adapted to process the threshold satisfaction indication to determine a historical probability that the digital information exceeds the threshold to produce a threshold satisfaction metric; and a gain adjuster communicatively coupled to the signal strength determiner, the accumulator, the first amplifier and the second amplifier, the gain adjuster adapted to selectively switch the first amplifier between the fixed gain setting and the unity gain setting and to vary the gain of the second amplifier based on the signal strength metric and the threshold satisfaction metric, wherein the gain adjuster is adapted to compare a current value of the signal strength metric with a prior value of the signal strength metric to determine whether the first amplifier should be set to the fixed gain setting and is further adapted to set the first amplifier to the unity gain setting when the current value of the signal strength metric is not substantially equal to the prior value of the signal strength metric.

6. An automatic gain controller for use with a receiver adapted to receive a broadcast signal having digital information encoded therein, the receiver including a first amplifier having a fixed gain setting and a unity gain setting, a second amplifier cascaded with the first amplifier, the second amplifier having a variable gain, the automatic gain controller comprising:

a signal strength determiner adapted to process the digital information to produce a signal strength metric representative of an average signal strength of the broadcast signal;

a threshold comparator adapted to process the digital information to produce a threshold satisfaction indication representative of a magnitude of the digital information in comparison to a threshold;

an accumulator communicatively coupled to the threshold comparator and adapted to process the threshold satisfaction indication to determine a historical probability that the digital information exceeds the threshold to produce a threshold satisfaction metric; and a gain adjuster communicatively coupled to the signal strength determiner, the accumulator, the first amplifier and the second amplifier, the gain adjuster adapted to selectively switch the first amplifier between the fixed gain setting and the unity gain setting and to vary the gain of the second amplifier based on the signal strength metric and the threshold satisfaction metric, wherein the gain adjuster is adapted to compare a current value of the signal strength metric with a prior value of the signal strength metric to determine whether the first amplifier should be set to the fixed gain setting and wherein the prior value of the signal strength metric is determined when the first amplifier is set to the unity gain setting and the current value of the signal strength metric is determined when the first amplifier is set to the fixed gain setting.

7. An automatic gain controller for use with a receiver adapted to receive a broadcast signal having digital information encoded therein, the receiver including a first amplifier having a fixed gain setting and a unity gain setting, a second amplifier cascaded with the first amplifier, the second amplifier having a variable gain, the automatic gain controller comprising:

a signal strength determiner adapted to process the digital information to produce a signal strength metric representative of an average signal strength of the broadcast signal;

a threshold comparator adapted to process the digital information to produce a threshold satisfaction indication representative of a magnitude of the digital information in comparison to a threshold;

an accumulator communicatively coupled to the threshold comparator and adapted to process the threshold satisfaction indication to determine a historical probability that the digital information exceeds the threshold to produce a threshold satisfaction metric; and a gain adjuster communicatively coupled to the signal strength determiner, the accumulator, the first amplifier and the second amplifier, the gain adjuster adapted to selectively switch the first amplifier between the fixed gain setting and the unity gain setting and to vary the gain of the second amplifier based on the signal strength metric and the threshold satisfaction metric, wherein the gain adjuster is adapted to compare a current value of the signal strength metric with a prior value of the signal strength metric to determine whether the first amplifier should be set to the fixed gain setting and wherein the prior value of the signal strength metric is determined when the first amplifier is set to the fixed gain setting and the current value of the signal strength metric is determined when the first amplifier is set to the unity gain setting.

8. An automatic gain controller for use with a receiver adapted to receive a broadcast signal having digital information encoded therein, the receiver including a first amplifier having a fixed gain setting and a unity gain setting, a second amplifier cascaded with the first amplifier, the second amplifier having a variable gain, the automatic gain controller comprising:

a signal strength determiner adapted to process the digital information to produce a signal strength metric representative of an average signal strength of the broadcast signal, a threshold comparator adapted to process the digital information to produce a threshold satisfaction indication representative of a magnitude of the digital information in comparison to a threshold;

an accumulator communicatively coupled to the threshold comparator and adapted to process the threshold satisfaction indication to determine a historical probability that the digital information exceeds the threshold to produce a threshold satisfaction metric; and a gain adjuster communicatively coupled to the signal strength determiner, the accumulator, the first amplifier and the second amplifier, the gain adjuster adapted to selectively switch the first amplifier between the fixed gain setting and the unity gain setting and to vary the gain of the second amplifier based on the signal strength metric and the threshold satisfaction metric, wherein the gain adjuster is adapted to compare a current value of the threshold satisfaction metric with a prior value of the threshold satisfaction metric to determine whether the first amplifier should be set to the fixed gain setting and wherein the gain adjuster is adapted to set the first amplifier to the fixed gain setting when the current value of the threshold satisfaction metric is substantially equal to the prior value of the threshold satisfaction metric.

9. An automatic gain controller for use with a receiver adapted to receive a broadcast signal having digital information encoded therein, the receiver including a first amplifier having a fixed gain setting and a unity gain setting, a second amplifier cascaded with the first amplifier, the second amplifier having a variable gain, the automatic gain controller comprising:

a signal strength determiner adapted to process the digital information to produce a signal strength metric representative of an average signal strength of the broadcast signal;

a threshold comparator adapted to process the digital information to produce a threshold satisfaction indication representative of a magnitude of the digital information in comparison to a threshold;

an accumulator communicatively coupled to the threshold comparator and adapted to process the threshold satisfaction indication to determine a historical probability that the digital information exceeds the threshold to produce a threshold satisfaction metric; and a gain adjuster communicatively coupled to the signal strength determiner, the accumulator, the first amplifier and the second amplifier, the gain adjuster adapted to selectively switch the first amplifier between the fixed gain setting and the unity gain setting and to vary the gain of the second amplifier based on the signal strength metric and the threshold satisfaction metric, wherein the gain adjuster is adapted to compare a current value of the threshold satisfaction metric with a prior value of the threshold satisfaction metric to determine whether the first amplifier should be set to the fixed gain setting and wherein the gain adjuster is adapted to set the first amplifier to the unity gain setting when the current value of the threshold satisfaction metric is not substantially equal to the prior value of the threshold satisfaction metric.

10. An automatic gain controller for use with a receiver adapted to receive a broadcast signal having digital information encoded therein, the receiver including a first amplifier having a fixed gain setting and a unity gain setting a second amplifier cascaded with the first amplifier, the second amplifier having a variable gain, the automatic gain controller comprising:

a signal strength determiner adapted to process the digital information to produce a signal strength metric representative of an average signal strength of the broadcast signal;

a threshold comparator adapted to process the digital information to produce a threshold satisfaction indication representative of a magnitude of the digital information in comparison to a threshold;

an accumulator communicatively coupled to the threshold comparator and adapted to process the threshold satisfaction indication to determine a historical probability that the digital information exceeds the threshold to produce a threshold satisfaction metric; and a gain adjuster communicatively coupled to the signal strength determiner, the accumulator, the first amplifier and the second amplifier, the gain adjuster adapted to selectively switch the first amplifier between the fixed gain setting and the unity gain setting and to vary the gain of the second amplifier based on the signal strength metric and the threshold satisfaction metric, wherein the gain adjuster is adapted to compare a current value of the threshold satisfaction metric with a prior value of the threshold satisfaction metric to determine whether the first amplifier should be set to the fixed gain setting and wherein the prior value of the threshold satisfaction metric is determined when the first amplifier is set to unity gain and the current value of the threshold satisfaction metric is determined when the first amplifier is set to the fixed gain setting.

11. An automatic gain controller for use with a receiver adapted to receive a broadcast signal having digital information encoded therein, the receiver including a first amplifier having a fixed gain setting and a unity gain setting, a second amplifier cascaded with the first amplifier, the second amplifier having a variable gain, the automatic gain controller comprising:

a signal strength determiner adapted to process the digital information to produce a signal strength metric representative of an average signal strength of the broadcast signal;

a threshold comparator adapted to process the digital information to produce a threshold satisfaction indication representative of a magnitude of the digital information in comparison to a threshold;

an accumulator communicatively coupled to the threshold comparator and adapted to process the threshold satisfaction indication to determine a historical probability that the digital information exceeds the threshold to produce a threshold satisfaction metric; and a gain adjuster communicatively coupled to the signal strength determiner, the accumulator, the first amplifier and the second amplifier, the gain adjuster adapted to selectively switch the first amplifier between the fixed gain setting and the unity gain setting and to vary the gain of the second amplifier based on the signal strength metric and the threshold satisfaction metric, wherein the gain adjuster is adapted to compare a current value of the threshold satisfaction metric with a prior value of the threshold satisfaction metric to determine whether the first amplifier should be set to the fixed gain setting and wherein the prior value of the threshold satisfaction metric is determined when the first amplifier is set to the fixed gain setting and the current value of the threshold satisfaction metric is determined when the first amplifier is set to unity gain.

12. An automatic gain control method for use with a receiver adapted to receive a broadcast signal having digital information encoded therein, the receiver including a first amplifier having a fixed gain setting and a unity gain setting, a second amplifier cascaded with the first amplifier, the second amplifier having a variable gain, the method comprising the steps of:

producing a first metric representative of a signal strength of the broadcast signal;

producing an indicator signal representative of a magnitude of the digital information in comparison to a threshold;

processing the indicator signal to determine a historical probability that the digital information exceeds the threshold to produce a second metric representative of an average signal strength of the signal; and selectively switching the first amplifier between the fixed gain setting and the unity gain setting and varying the gain of the second amplifier based on the first metric and the second metric, wherein comparing a current value of the first metric with a prior value of the first metric is performed to determine whether the first amplifier should be set to the fixed gain setting, wherein selectively switching comprises switching the first amplifier to the unity gain setting when the current value of the first metric is not substantially equal to the prior value of the first metric.

13. The method of claim 12, wherein the step of producing the first metric includes the step of calculating an average signal strength based on the digital information.

14. The method of claim 12, wherein the step of selectively switching includes the steps of:

storing a first value of the second metric;

switching the first amplifier between the unity gain setting and the fixed gain setting;

determining a second value of the second metric; and comparing the first value of the second metric to the second value of the second metric.

15. The method of claim 12, wherein the step of selectively switching includes the steps of:

storing a first value of the first metric;

switching the first amplifier between the unity gain setting and the fixed gain setting;

determining a second value of the first metric; and comparing the first value of the first metric to the second value of the first metric.

16. An automatic gain control method for use with a receiver adapted to receive a broadcast signal having digital information encoded therein, the receiver including a first amplifier having a fixed gain setting and a unity gain setting, a second amplifier cascaded with the first amplifier, the second amplifier having a variable gain, the method comprising the steps of:

producing a first metric representative of a signal strength of the broadcast signal;

producing an indicator signal representative of a magnitude of the digital information in comparison to a threshold;

processing the indicator signal to determine a historical probability that the digital information exceeds the threshold to produce a second metric representative of an average signal strength of the signal; and selectively switching the first amplifier between the fixed gain setting and the unity gain setting and varying the gain of the second amplifier based on the first metric and the second metric, wherein comparing a current value of the first metric with a prior value of the first metric is performed to determine whether the first amplifier should be set to the fixed gain setting, wherein selectively switching comprises the step of switching the first amplifier to the fixed gain setting when the current value of the first metric is substantially equal to the prior value of the first metric.

17. An automatic gain control method for use with a receiver adapted to receive a broadcast signal having digital information encoded therein, the receiver including a first amplifier having a fixed gain setting and a unity gain setting, a second amplifier cascaded with the first amplifier, the second amplifier having a variable gain, the method comprising the steps of:

producing a first metric representative of a signal strength of the broadcast signal;

producing an indicator signal representative of a magnitude of the digital information in comparison to a threshold;

processing the indicator signal to determine a historical probability that the digital information exceeds the threshold to produce a second metric representative of an average signal strength of the signal; and selectively switching the first amplifier between the fixed gain setting and the unity gain setting and varying the gain of the second amplifier based on the first metric and the second metric, wherein selectively switching comprises comparing a current value of the second metric with a prior value of the second metric to determine whether the first amplifier should be set to the fixed gain setting and wherein selectively switching comprises switching the first amplifier to the unity gain setting when the current value of the second metric is not substantially equal to the prior value of the first metric.

18. An automatic gain control method for use with a receiver adapted to receive a broadcast signal having digital information encoded therein, the receiver including a first amplifier having a fixed gain setting and a unity gain setting, a second amplifier cascaded with the first amplifier, the second amplifier having a variable gain, the method comprising the steps of:

producing a first metric representative of a signal strength of the broadcast signal;

producing an indicator signal representative of a magnitude of the digital information in comparison to a threshold;

processing the indicator signal to determine a historical probability that the digital information exceeds the threshold to produce a second metric representative of an average signal strength of the signal; and selectively switching the first amplifier between the fixed gain setting and the unity gain setting and varying the gain of the second amplifier based on the first metric and the second metric, wherein selectively switching comprises comparing a current value of the second metric with a prior value of the second metric to determine whether the first amplifier should be set to the fixed gain setting and wherein selectively switching comprises switching the first amplifier to the fixed gain setting when the current value of the second metric is substantially equal to the prior value of the first metric.

19. An automatic gain controller for use with a receiver having a processor, the receiver adapted to receive a broadcast signal having digital information encoded therein, the receiver including a first amplifier having a fixed gain setting and a unity gain setting, a second amplifier cascaded with the first amplifier, the second amplifier having a variable gain, the automatic gain controller comprising:

a memory communicatively coupled to the processor;

a first routine stored on the memory for causing the processor to process the digital information to produce a signal strength metric representative of an average signal strength of the broadcast signal;

a second routine stored on the memory for causing the processor to process the digital information to produce a threshold satisfaction indication representative of a magnitude of the digital information in comparison to a threshold;

a third routine stored on the memory for causing the processor to process the threshold satisfaction indication to determine a historical probability that the digital information exceeds the threshold to produce a threshold satisfaction metric; and a fourth routine stored on the memory for causing the processor to selectively switch the first amplifier between the fixed gain setting and the unity gain setting and to vary the gain of the second amplifier based on the signal strength metric and the threshold satisfaction metric, wherein the fourth routine, when executed, causes the processor to compare a current value of the signal strength metric with a prior value of the signal strength metric to determine whether the first amplifier should be set to the fixed gain setting and to set the first amplifier to the fixed gain setting when the current value of the signal strength metric is substantially equal to the prior value of the signal strength metric.

20. The gain controller of claim 19, wherein the fourth routine is further adapted to cause the processor to compare a current value of the second metric with a prior value of the second metric to determine whether the first amplifier should be set to the fixed gain setting.

21. The gain controller of claim 19, wherein the fourth routine is further adapted to cause the processor to store a first value of the second metric, to switch the first amplifier between the unity gain setting and the fixed gain setting, to determine second value of the second metric and to compare the first value of the second metric to the second value of the second metric.

22. The gain controller of claim 19, wherein the fourth routine is further adapted to cause the processor to store a first value of the first metric, to switch the first amplifier between the unity gain setting and the fixed gain setting, to determine second value of the first metric and to compare the first value of the first metric to the second value of the first metric.

* * * * *